(12) United States Patent
Ko (10) Patent No.: US 8,963,606 B2
(45) Date of Patent: Feb. 24, 2015

(54) CLOCK CONTROL DEVICE

(71) Applicant: SK Hynix Inc., Icheon-si, Gyeonggi-do (KR)

(72) Inventor: Bok Rim Ko, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/078,750

(22) Filed: Nov. 13, 2013

(65) Prior Publication Data

US 2014/0368241 A1 Dec. 18, 2014

(30) Foreign Application Priority Data

Jun. 17, 2013 (KR) ........................ 10-2013-0068833

(51) Int. Cl.
*G06F 1/04* (2006.01)
*H03K 3/00* (2006.01)
*G11C 7/00* (2006.01)
*H03K 3/012* (2006.01)

(52) U.S. Cl.
CPC ..................................... *H03K 3/012* (2013.01)
USPC ....... 327/296; 327/291; 365/222; 365/189.06

(58) Field of Classification Search
USPC .......... 327/291–299; 365/222, 193, 191, 194, 365/189.05, 230.08, 233.1, 233.13
See application file for complete search history.

(56) References Cited

U.S. PATENT DOCUMENTS

| 6,275,086 B1 * | 8/2001 | Douchi et al. ................. 327/296 |
| 7,903,491 B2 | 3/2011 | Lee |
| 8,050,128 B2 * | 11/2011 | Lee .............................. 365/222 |

FOREIGN PATENT DOCUMENTS

KR 1020070117248 A 12/2007

* cited by examiner

*Primary Examiner* — Lincoln Donovan
*Assistant Examiner* — Thomas Skibinski
(74) *Attorney, Agent, or Firm* — William Park & Associates Patent Ltd.

(57) ABSTRACT

A clock control device is disclosed, which relates to a technology for reducing the amount of current consumption when a semiconductor device operates at a high speed. The clock control device includes: a chip-select-signal control block configured to generate a chip-select-control signal by latching a chip select signal, and output a fast chip select signal according to the chip-select-control signal; and a clock control block configured to drive a clock signal in response to the fast chip select signal when a command clock enable signal is activated, thereby generating a clock control signal, wherein the chip-select-signal control block latches the chip-select-control signal, and controls the chip-select-control signal to be toggled after the command clock enable signal is transitioned.

20 Claims, 7 Drawing Sheets

CLOCK CONTROL DEVICE

CROSS-REFERENCE TO RELATED APPLICATION

This application claims priority to Korean patent application No. 10-2013-0068833, filed on Jun. 17, 2013, in the Korean Intellectual Property Office, which is incorporated herein by reference in its entirety as set forth in full.

BACKGROUND OF THE INVENTION

1) Field of the Invention

Embodiments of the present invention relate to a clock control device, and more particularly to a technology for reducing the amount of current consumption when a semiconductor device operates at a high speed.

2) Description of the Related Art

With the increasing integration degree of semiconductor memory devices, semiconductor memory devices have also been continuously improved to increase the operation speed. In order to increase operation speeds of semiconductor memory devices, synchronous memory devices capable of operating by synchronizing with an external clock of a memory chip have been recently proposed and developed.

A representative example of a synchronous memory device is a single data rate (SDR) synchronous memory device that is synchronized with a rising edge of an external clock of a memory device such that one data piece can be input and/or output at one data pin during one period of the clock.

However, the SDR synchronous memory device has difficulty in satisfying a high-speed operation of the system. In order to solve the problem of the SDR synchronous memory device, a double data rate (DDR) synchronous memory device capable of processing two data pieces during one clock period has been proposed.

Two contiguous data pieces are input and output through respective data input/output (I/O) pins of the DDR synchronous memory device, such that the two contiguous data pieces are synchronized with a rising edge and a falling edge of an external input clock. Therefore, although a clock frequency of the DDR synchronous memory device is not increased, the DDR synchronous memory device may have a bandwidth that is at least two times larger than that of the SDR synchronous memory device, such that the DDR synchronous memory device can operate at a higher speed than the SDR synchronous memory device.

The DDR synchronous memory device is configured to use a multi-bit prefetching scheme capable of simultaneously processing multiple bits (multi-bit) of data pieces. The multi-bit prefetch scheme synchronizes sequential input data pieces with a data strobe signal such that the input data pieces can be arranged in parallel to one another. Thereafter, the multi-bit prefetch scheme can simultaneously store the arranged multi-bit data pieces upon receiving a write command synchronized with an external clock signal.

However, it is important for a low-power DDR synchronous memory device operated at a low power-supply voltage to reduce the amount of current consumption. For this purpose, the low-power DDR synchronous memory device should operate an internal clock only within a specific interval required for reducing an operation current. That is, the conventional low-power DDR synchronous memory device operates an internal clock only during a suitable time upon receiving a command using a setup time of a chip select signal, and disables the internal clock during the remaining time intervals other than the suitable time, such that it reduces the operation current.

However, as the operation frequency of the memory device gradually increases, each of a setup time and a hold time of the chip select signal is applied for a short period of time. In the case of a manufactured product operated at a low power-supply voltage, a defective margin frequently occurs between an address and an operation command such that the product has difficulty in controlling an internal clock only using the setup time of the chip select signal.

BRIEF SUMMARY OF THE INVENTION

Various embodiments of the present invention are directed to providing a clock control device that substantially obviates one or more problems due to limitations and disadvantages of the related art.

The embodiment of the present invention relates to a clock control device for reducing the amount of current consumption by controlling an internal clock using a chip select signal when a semiconductor device operates at a high speed.

In accordance with an embodiment of the present invention, a clock control device includes: a chip-select-signal control block configured to generate a chip-select-control signal by latching a chip select signal, and output a fast chip select signal according to the chip-select-control signal; and a clock control block configured to drive a clock signal in response to the fast chip select signal when a command clock enable signal is activated, thereby generating a clock control signal, wherein the chip-select-signal control block latches the chip-select-control signal, and controls the chip-select-control signal to be toggled after the command clock enable signal is transitioned.

In accordance with another embodiment of the present invention, a clock control device includes: a first buffer configured to buffer a chip select signal during a normal operation; a second buffer configured to buffer the chip select signal during a high-speed operation; a chip-select-signal controller configured to generate a fast chip select signal by combining an output signal of the second buffer and a chip-select-control signal; a delay unit configured to delay an output signal of the first buffer; a latch unit configured to latch an output signal of the delay unit in response to a clock control signal, and output the chip-select-control signal; and a clock controller configured to control a clock enable signal according to a command clock enable signal, the fast chip select signal, and the clock control signal.

It is to be understood that both the foregoing general description and the following detailed description of the present invention are for example and explanatory and are intended to provide further explanation of the invention as claimed.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Figure 1:
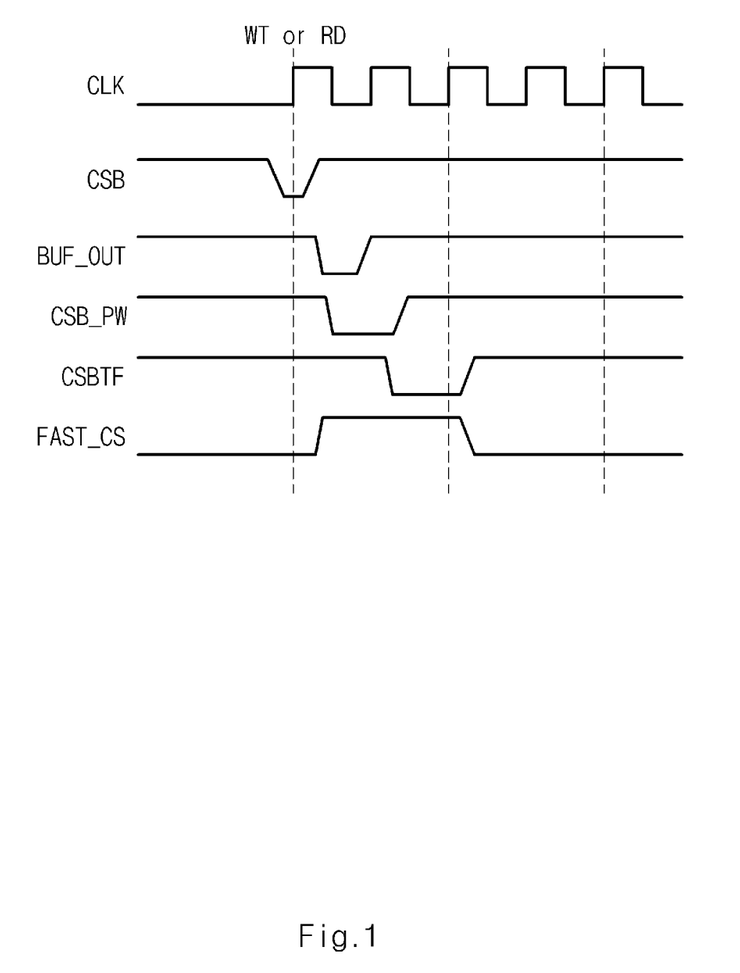
FIG. 1 is a timing diagram illustrating the operation of a chip-select-signal controller of a clock control device.

FIG. 1 is a timing diagram illustrating operations of a chip-select-signal controller 140 (to be described later) of a clock control device.

Referring to FIG. 1, during a write (WT) or read (RD) operation, a chip select signal (CSB) is activated to a low level. A fast buffer 130 (to be described later) outputs an output signal (BUF_OUT) by buffering the CSB.

A time delay unit 141 (to be described later) delays a signal generated at a specific time at which the output signal (BUF_OUT) transitions from a low level to a high level for a predetermined time, such that the delay unit 141 generates a control signal (CSBTF_PW). A NAND gate (ND1) combines the control signal (CSBTF_PW) of a logic low level, a chip-select-control signal (CSBTF) of a logic low level, and the output signal (BUF_OUT) of a logic low level, such that the NAND gate (ND1) outputs a fast chip select signal (FAST_CS) of a logic high level.

Figure 2:
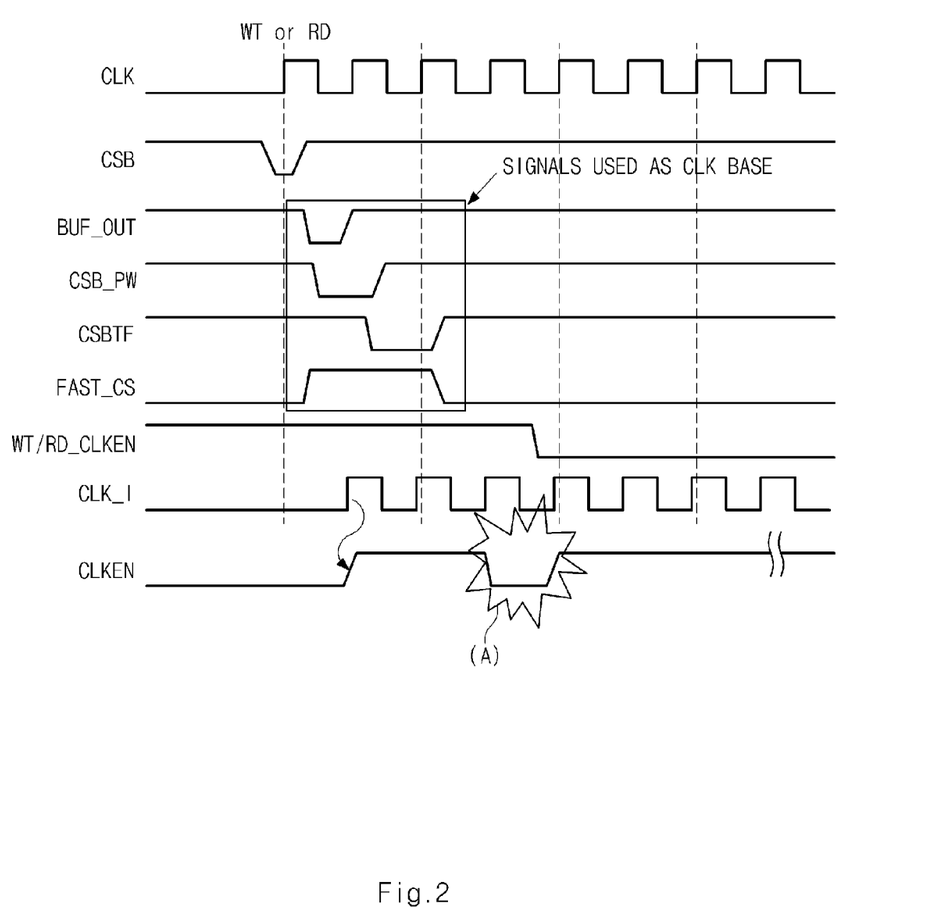
FIG. 2 is a timing diagram illustrating problems encountered when the clock control device operates at a high speed as shown in the timing diagram of FIG. 1.

FIG. 2 is a timing diagram illustrating a problem encountered when the clock control device operates at a high speed as shown in the timing diagram of FIG. 1.

Referring to FIG. 2, the output signal (BUF_OUT), the control signal (CSBTF_PW), the chip-select-control signal (CSBTF), and the fast chip select signal (FAST_CS) are interoperable with a clock (CLK) base.

A common clock enable signal (WT/RD_CLKEN) is activated by the write (WT) or read (RD) command. The command clock enable signal (WT/RD_CLKEN) has an asynchronous delay time after lapse of the clock (CLK) at which the write (WT) or read (RD) command is received. During a low-speed operation, since a setup time of the chip select signal (CSB) is set to a long time, the output signal (BUF_OUTB) is latched in response to the clock (CLK) such that the latched signal may be used as a start point of the internal clock generation interval.

However, although a delay time of the clock CLK is similar to that of the low-speed operation, the setup time of the chip select signal CSB is reduced during high-speed operation. As a result, a clock control signal (CLK_I) generated by a command applying clock (CLK) does not latch the output signal (BUF_OUTB).

In the case of a high-speed operation in DDR4 specification, the operation speed obtained from a high-pulse period of the fast chip select signal (FAST_CS) may be higher than the operation speed obtained at a specific time at which the command clock enable signal transitions from a high level to a low level. In this case, a clock enable signal (CLKEN) unnecessarily transitions to a low level in a specific time interval as shown in (A) of FIG. 2. In more detail, the command clock enable signal (WT/RD_CLKEN) is generated after the command signal is input. Assuming that the fast chip select signal (FAST_CS) transitions earlier than the command clock enable signal (WT/RD_CLKEN), the clock enable signal (CLKEN) abnormally occurs.

Figure 3:
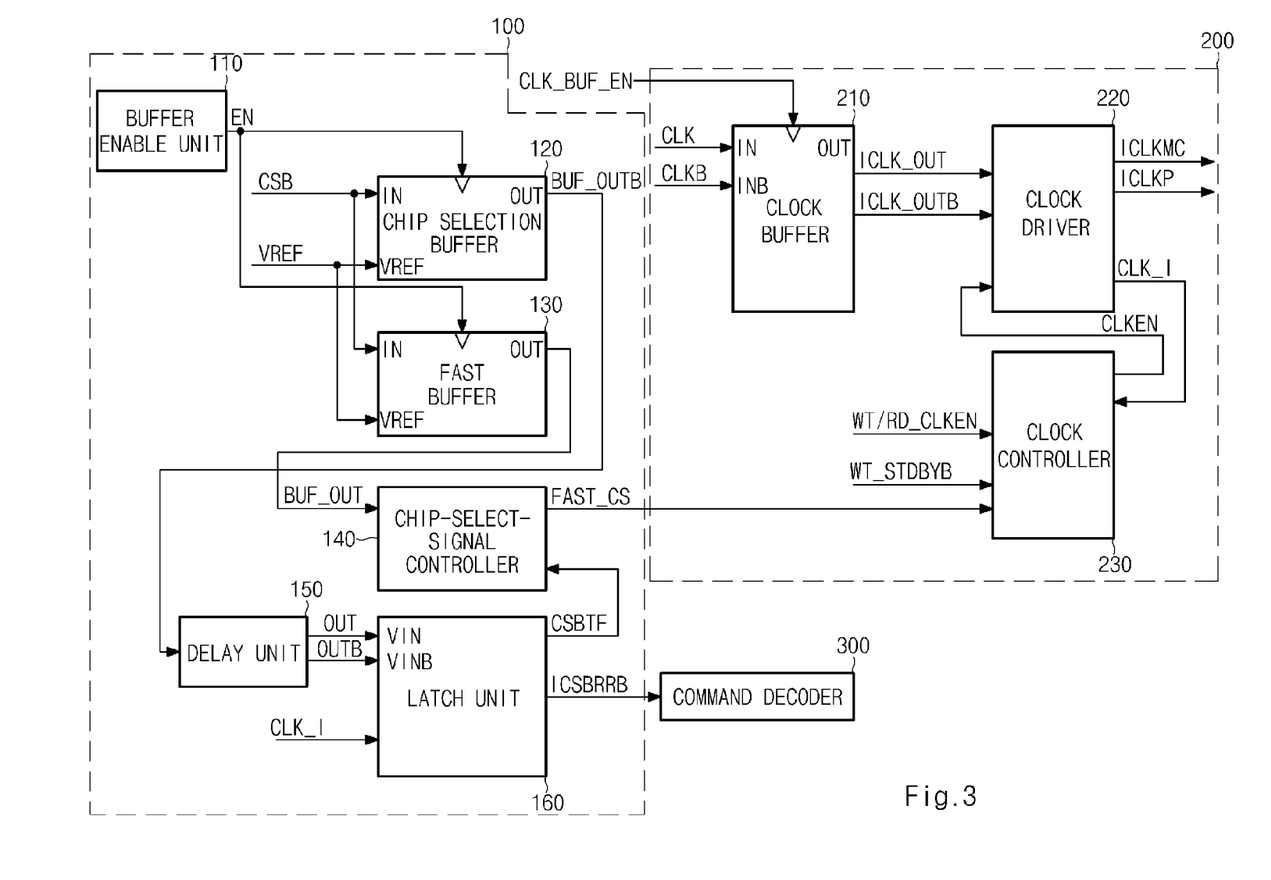
FIG. 3 is a block diagram illustrating the clock control device according to an embodiment.

FIG. 3 is a block diagram illustrating a clock control device according to an embodiment.

Referring to FIG. 3, the clock control device according to an embodiment includes a chip-select-signal control block 100 and a clock control block 200.

The chip-select-signal control block 100 receives the chip select signal (CSB) as an input, latches the chip select signal (CSB), and outputs a fast chip select signal (FAST_CS) according to the chip select signal (CSB). The fast chip select signal (FAST_CS) may be required for a high-speed operation. In addition, when the command clock enable signal (WT/RD_CLKEN) is activated, the clock control block 200 drives the clock (CLK) in response to the fast chip select signal (FAST_CS), and generates an internal clock control signal (ICLKMC). The clock control block 200 latches the fast chip select signal (FAST_CS), and toggles the fast chip select signal (FAST_CS) after transition of the command clock enable signal (WT/RD_CLKEN).

In an embodiment, the chip-select-signal control block 100 includes a buffer enable unit 110, a chip select buffer 120, a fast buffer 130, a chip-select-signal controller 140, a delay unit 150, and a latch unit 160. The clock control block 200 includes a clock buffer 210, a clock driver 220, and a clock controller 230.

The buffer enable unit 110 outputs an enable signal EN for activating the chip select buffer 120 and the fast buffer 130. The chip-select-signal control block 100 includes a chip select buffer 120 for buffering the chip select signal (CSB) during normal operation, and a fast buffer 130 for buffering the chip select signal (CSB) during the high-speed operation.

The chip select buffer 120, acting as a first buffer, is activated by an enable signal (EN) received from the buffer enable unit 110 during the normal operation. The chip select buffer 120 receives the chip select signal (CSB) and a reference voltage, and outputs an output signal (BUF_OUTB) to the delay unit 150.

The fast buffer 130, acting as a second buffer, is activated by the enable signal (EN) received from the buffer enable unit 110 during the high-speed operation. The fast buffer 130 receives the chip select signal (CSB) and the reference voltage, and outputs an output signal (BUF_OUT) to the chip-select-signal controller 140.

The chip-select-signal controller 140 receives the output signal (BUF_OUT) from the fast buffer 130 and the chip-select-control signal (CSBTF) from the latch unit 160, and the chip-select-signal controller 140 activates/outputs the fast chip select signal (FAST_CS) for the high-speed operation.

In addition, the delay unit 150 selectively adjusts the setup/hold time of the output signal (BUF_OUTB) received from the chip select buffer 120, such that the delay unit 150 outputs delay signals (OUT, OUTB). The latch unit 160 latches the delay signals (OUT, OUTB) in response to the clock control signal (CLK_I), and the latch unit 160 outputs the chip-select-control signal (CSBTF) to the chip-select-signal controller 140. Further, in one embodiment, the latch unit 160 may output an latched chip select signal (ICSBRRB) to the internal command decoder 300.

The clock buffer 210 is activated by the clock buffer enable signal (CLK_BUF_EN). The clock buffer 210 receives the clock signals (CLK, CLKB), and outputs internal clock signals (ICLK_OUT, ICLK_OUTB). In some examples, the clock (CLK) has a phase opposite to that of the other clock (CLKB). The internal clock (ICLK_OUT) has a phase opposite to that of the internal clock (ICLK_OUTB).

The clock driver 220 drives the internal clocks (ICLK_OUT, ICLK_OUTB) in response to the clock enable signal (CLKEN), such that the clock driver 220 outputs an internal clock control signal (ICLKMC), an internal clock pulse (ICLKP), and a clock control signal (CLK_I).

The clock controller 230 receives the clock control signal (CLK_I), the fast chip select signal (FAST_CS), the command clock enable signal (WT/RD_CLKEN), and a standby signal (WT_STDBYB), and the clock controller 230 outputs the clock enable signal CLKEN for controlling the clock driver 220. If the command clock enable signal (WT/RD_CLKEN) is activated, the clock controller 230 is synchronized with the clock control signal (CLK_I) after a lapse of a predetermined time, such that the clock controller 230 outputs the clock enable signal (CLKEN). In contrast, the clock controller 230 deactivates the clock enable signal (CLKEN) when the standby signal (WT_STDBYB) is activated, such that clock controller 230 outputs a deactivated clock enable signal (CLKEN).

Figure 4:
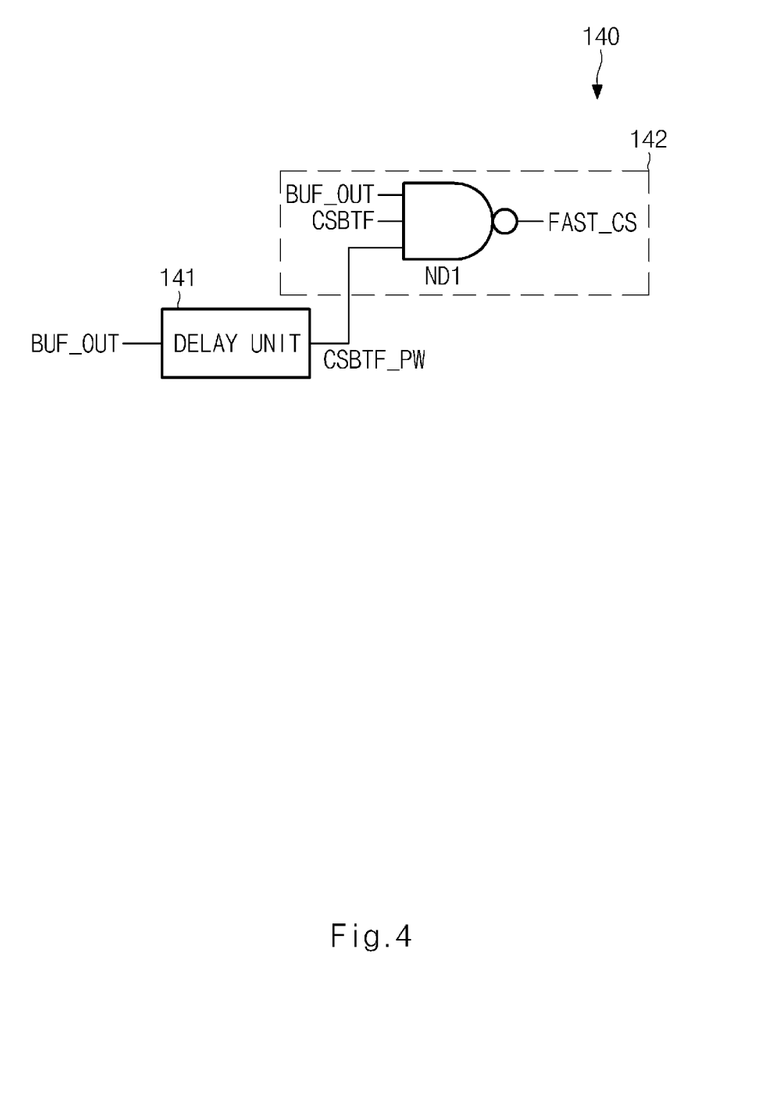
FIG. 4 is a detailed circuit diagram illustrating the chip-select-signal controller according to an embodiment of FIG. 3.

FIG. 4 is a detailed circuit diagram illustrating the chip-select-signal controller 140 according to an embodiment of FIG. 3.

Referring to FIG. 4, the chip-select-signal controller 140 includes a delay unit 141 and a combination unit 142. The delay unit 141 delays the output signal (BUF_OUT) received from the fast buffer 130 for a predetermined time, and outputs the control signal (CSBTF_PW). In some embodiments, the delay unit 141 delays a signal for a predetermined time such that the delay unit 141 outputs a control signal (CSBTF_PW). The signal that the delay unit 141 delays may have been generated at a specific time at which the output signal (BUF_OUT) transitions from a low level to a high level.

In addition, the combination unit 142 includes a NAND gate ND1. In this case, the NAND gate ND1 performs a NAND operation of the control signal (CSBTF_PW), the chip-select-control signal (CSBTF), and the output signal (BUF_OUT), such that the NAND gate ND1 outputs a fast chip select signal (FAST_CS).

Figure 5:
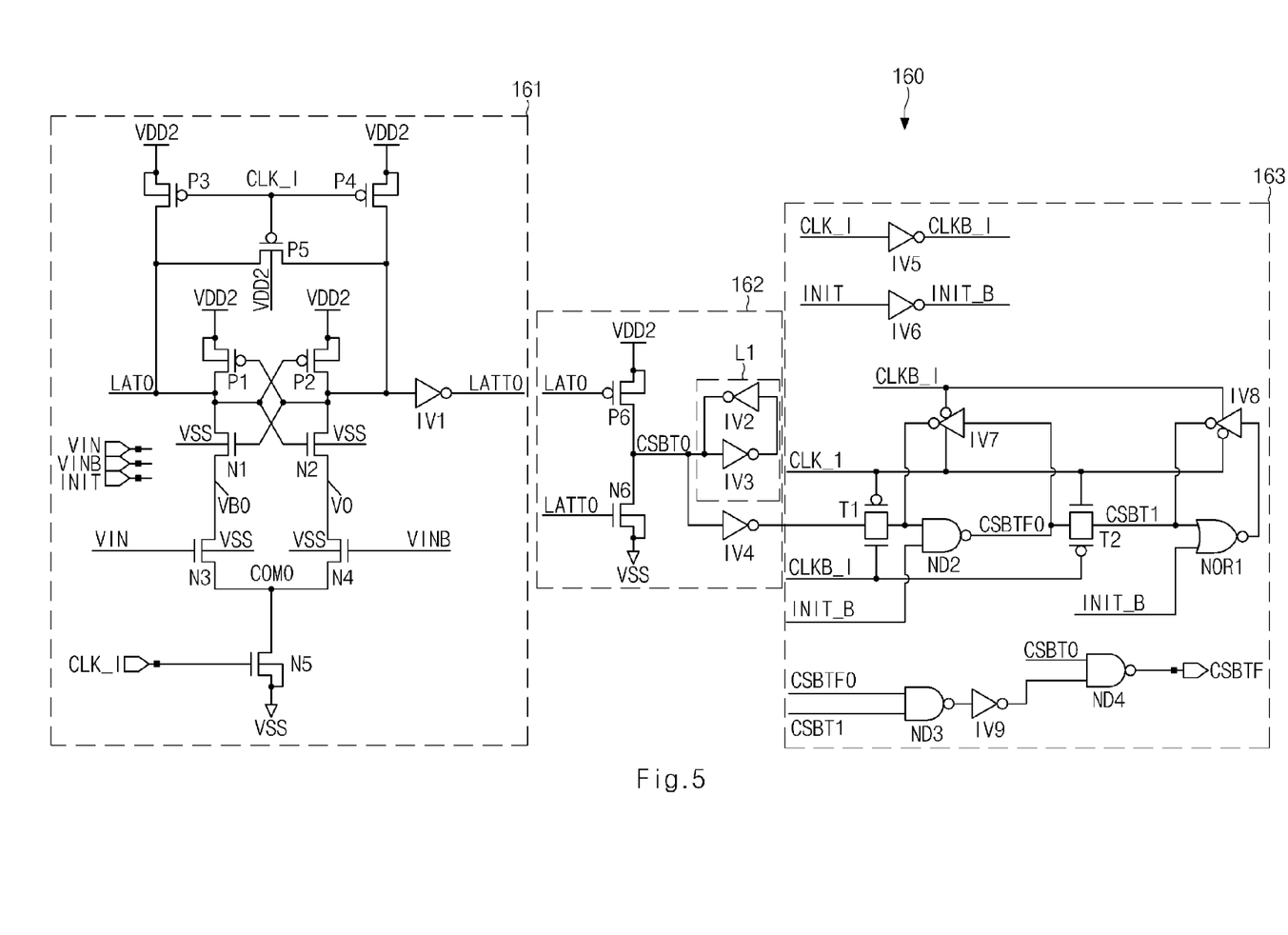
FIG. 5 is a detailed circuit diagram illustrating a latch unit according to an embodiment of FIG. 3.

FIG. 5 is a detailed circuit diagram illustrating a latch unit 160 according to an embodiment of FIG. 3.

Referring to FIG. 5, the latch unit 160 includes a comparator 161, a latch controller 162, and a control signal generator 163.

In this case, the comparator 161 includes a plurality of NMOS transistors (N1~N5), a plurality of PMOS transistors (P1~P5), and an inverter IV1. The PMOS transistors (P1, P2) are cross-coupled to the NMOS transistors (N1, N2).

The PMOS transistors (P1, P2) receive the power-supply voltage VDD2 through their source terminals. The NMOS transistors (N1, N2) are coupled to nodes (V0, VB0) through their source terminals. The PMOS transistor P1 and the NMOS transistor N1 output a latch signal LAT0 through a common drain terminal. The PMOS transistor P2 and the NMOS transistor N2 are coupled to an inverter IV1 through a common drain terminal. The inverter IV1 inverts a signal received from a common drain terminal of the PMOS transistor P2 and the NMOS transistor N2, such that the inverter IV1 outputs a latch signal (LATT0).

A PMOS transistor P3 is coupled between an input terminal of a power supply-voltage (VDD2) and an output signal of the latch signal (LAT0). A PMOS transistor P4 is coupled between an input terminal of the power-supply voltage (VDD2) and an input terminal of the inverter IV1. A PMOS transistor P5 is coupled between drain terminals of the PMOS transistors P3 and P4. The PMOS transistors (P3~P5) receive a clock control signal (CLK_I) through a common gate terminal.

NMOS transistor N3 is coupled between a node VB0 and a node COM0, and the NMOS transistor N3 receives a delay signal OUT from the delay unit 150 through a gate terminal VIN. NMOS transistor N4 is coupled between the node V0 and the node COM0, such that the NMOS transistor N4 receives a delay signal OUTB from the delay unit 150 through a gate terminal (VINB).

NMOS transistor N5 is coupled between the node COM0 and an input terminal of a ground voltage (VSS), such that the NMOS transistor N5 receives a clock control signal (CLK_I) through a gate terminal. An activation state of the comparator 161 is selectively controlled by the clock control signal (CLK_I).

The latch controller 162 includes a PMOS transistor P6, an NMOS transistor N6, and a plurality of inverters IV2~IV4. Here, the PMOS transistor P6 and the NMOS transistor N6 are coupled in series between the VDD2 input terminal and the VSS input terminal.

PMOS transistor P6 receives the latch signal LAT0 through a gate terminal. NMOS transistor N6 receives the latch signal LATT0 through a gate terminal. The PMOS transistor P6 and the NMOS transistor N6 output a control signal (CSBT0) through a common drain terminal.

A latch L1 includes inverters (IV2, IV3), arranged such that an output terminal of IV2 is coupled to an input terminal of IV3, and an output terminal of IV3 is coupled with an input terminal of IV2. A control signal (CSBT0) is applied to an input terminal of the inverter IV3. The inverter IV4 inverts the control signal (CSBT0), and outputs the inverted control signal (CSBT0).

The control signal generator 163 includes a plurality of transfer gates (T1, T2), a plurality of NAND gates (ND2~ND4), a NOR gate NOR1, and a plurality of inverters (IV5~IV9). The inverter IV5 inverts the clock control signal (CLK_I), such that the inverter IV5 outputs a clock control signal (CLKB_I). The inverter IV6 inverts an initialization signal (INIT) such that the inverter IV6 outputs an initialization signal (INIT_B). In one example, the initialization signal (INIT) and the other initialization signal (INIT_B) are used to initialize setting of the latch unit 160 during a power-up or reset operation.

The transfer gate T1 selectively outputs an output signal of the inverter IV4 in response to the clock signal signals (CLK_I, CLKB_I). The NAND gate ND2 performs a NAND operation between an output signal of the transfer gate T1 and the initialization signal (INIT_B), such that the NAND gate ND2 outputs a control signal CSBTF0. The inverter IV7 is coupled between the input/output (I/O) terminals of the NAND gate ND2, such that the inverter IV7 is driven by the clock control signals (CLK_I, CLKB_I).

The transfer gate T2 may selectively output the control signal CSBTF0 in response to the clock control signals (CLK_I and CLKB_I). The transfer gate T2 is complementary to the transfer gate T1 in operation. A NOR gate NOR1 performs a NOR operation on the control signal CSBT1, serving as an output signal of the transfer gate T2, and the initialization signal INIT_B. The inverter IV8 is coupled between the input/output (I/O) terminals of the NOR gate NOR1, such that the inverter IV8 is driven by the clock control signals (CLK_I, CLKB_I).

A NAND gate ND3 performs a NAND operation on the control signal (CSBTF0) and the control signal (CSBT1). An inverter IV9 inverts an output signal of the NAND gate ND3. A NAND gate ND4 performs a NAND operation on the control signal (CSBT0) and the output of the inverter IV9, such that NAND gate ND4 outputs the chip-select-control signal (CSBTF).

Figure 6:
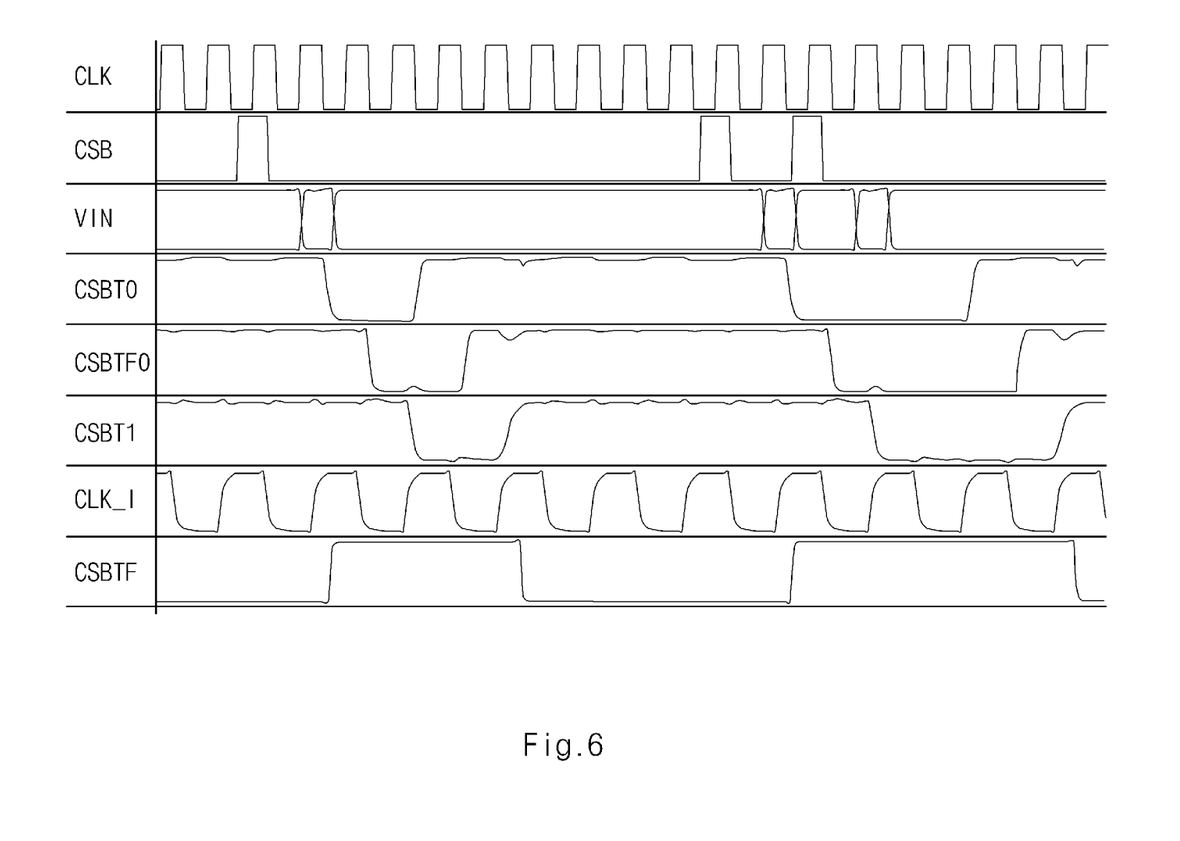
FIG. 6 is a timing diagram illustrating operations of the latch unit shown in FIG. 5.

Detailed operations of the latch unit 160 will hereinafter be described with reference to FIG. 6.

The comparator 161 receives one delay signal (OUT) and the other delay signal (OUTB) from the delay unit 150 through a VIN terminal and a VINB terminal, respectively. The comparator 161 compares two signals received from the VIN and VINB terminals with each other, such that the comparator 161 outputs the latch signals (LAT0, LATT0).

If the clock control signal (CLK_I) is activated to a high level, the NMOS transistor N5 is turned on such that the comparator 161 compares delay signal (OUT) and delay signal (OUTB). The comparator 161 may change the logic states of the latch signals (LAT0, LATT0) in response to the delay signals (OUT, OUTB).

In contrast, if the clock control signal (CLK_I) is deactivated to a low level, the PMOS transistors (P3~P4) are turned on, such that the output signal of the comparator 161 is precharged with a power-supply voltage (VDD2) level so that the latch controller 162 does not operate. When the latch signal LAT0 goes high in level, and the latch signal LATT0 goes low in level, the PMOS transistor P6 and the NMOS transistor N6 of the latch controller 162 are turned off.

The latch controller 162 may control a delay state of the control signal CSBT0 in response to the latch signals (LAT0, LATT0). If the latch signal LAT0 goes to a low level, the PMOS transistor P6 is turned on, such that the control signal CSBT0 is output at a VDD2 level. If the latch signal LATT0 goes to a high level, the NMOS transistor N6 is turned on, such that the control signal CSBT0 is output at a VSS level.

The control signal generator 163 may synchronize the control signal CSBT0 with the clock signal (CLKB_I), such that the control signal generator 163 outputs the chip-select-control signal CSBTF. That is, the control signal generator 163 may shift the control signal by one clock, such that the control signal generator 163 outputs a control signal CSBT1.

The transfer gate T1 is turned on when the clock control signal (CLK_I) is at a low level, such that the transfer gate T1 outputs an inversion signal of the control signal CSBT0. The transfer gate T2 is turned on when the clock control signal (CLK_I) is at a high level, such that the transfer gate T1 outputs the control signal CSBT1.

The NAND gate ND3 performs a NAND operation between the control signal CSBTF0, primarily latched at a low level of the clock control signal (CLK_I), and the control signal CSBT1, secondarily latched at a high level of the clock control signal (CLK_I).

The NAND gate ND4 of the control signal generator 163 performs a NAND operation between an original control signal CSBT0 and the control signal CSBT0 shifted by one clock, such that a high-level period of the chip-select-control signal CSBTF is delayed and output. Therefore, the chip-select-control signal CSBTF is toggled at a time later than the command clock enable signal (WT/RD_CLKEN). If the initialization signal (INIT_B) is activated, the control signal generator 163 may be initialized. Thus, in one embodiment, the chip-select-signal control block 100 latches the chip-select-control signal CSBTF, and controls the chip-select-control signal CSBTF to be toggled after the command clock enable signal (WT/RD_CLKEN) is transitioned.

As described above, the comparator 161 and the latch controller 162 may latch the delay signals (OUT, OUTB) in response to the clock control signal (CLK_I), and output the control signal CSBT0. The control signal generator 163 may latch the control signal CSBT0 in response to the clock control signal (CLK_I), and shift a transition time of the control signal CSBT0. Accordingly, the fast chip select signal (FAST_CS) is prevented from being toggled earlier than the command clock enable signal (WT/RD_CLKEN).

Figure 7:
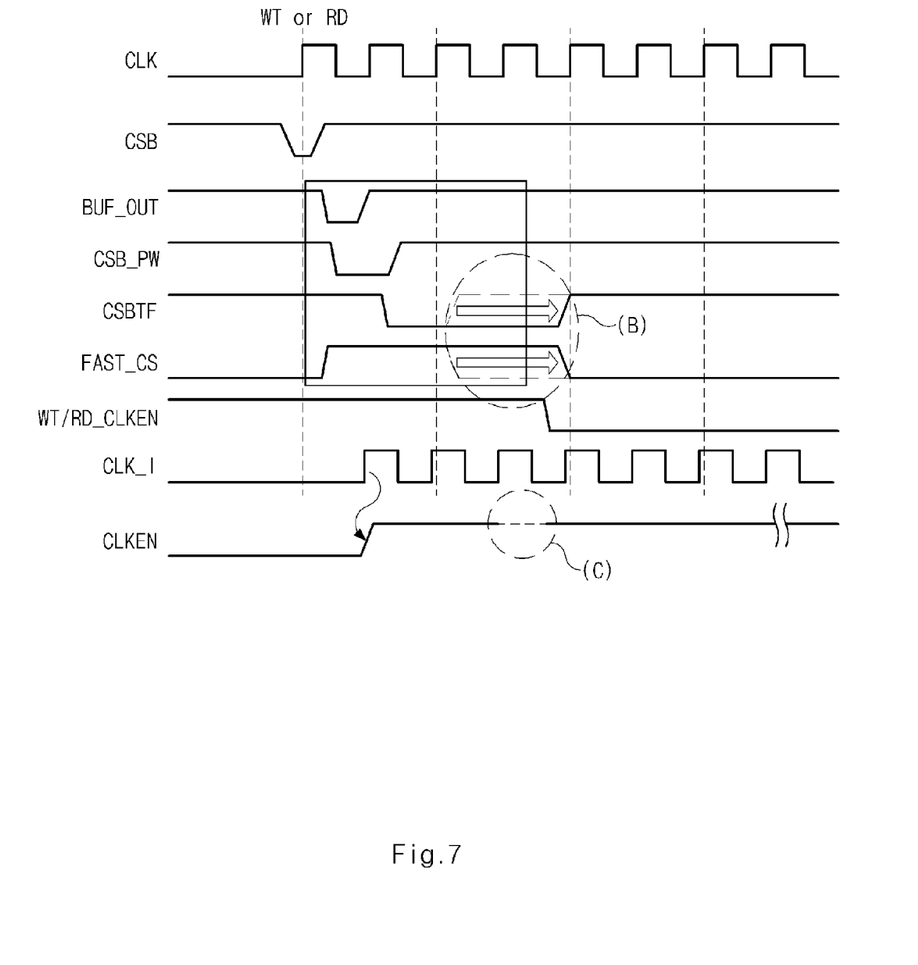
FIG. 7 is a timing diagram illustrating operations of the clock control device according to an embodiment of FIG. 3.

FIG. 7 is a timing diagram illustrating operations of the clock control device according to an embodiment of FIG. 3.

Referring to FIG. 7, the chip select signal CSB is activated to a low level when the write (WT) or read (RD) operation. The fast buffer 130 buffers the chip select signal CSB, such that the fast buffer 130 outputs the output signal (BUF_OUT).

The delay unit 141 of the chip-select-signal controller 140 delays a signal generated at a specific time at which the output signal (BUF_OUT) transitions from a low level to a high level for a predetermined time, such that the delay unit 141 generates the control signal (CSBTF_PW). The NAND gate ND1 combines a control signal (CSBTF_PW) of a low level, a chip-select-control signal (CSBTF) of a low level, and an output signal (BUF_OUT) of a low level, such that NAND gate ND1 outputs the fast chip select signal (FAST_CS) of a high level. After a lapse of a predetermined time after receiving the write (WT) or read (RD) command, the command clock enable signal (WT/RD_CLKEN) is transitioned to a low level.

To prevent an occurrence of the timing error illustrated in FIG. 2, each of the chip-select-control signal CSBTF and the fast chip select signal (FAST_CS) is delayed for a predetermined time, such that the delayed chip-select-control signal CSBTF and the delayed fast chip select signal (FAST_CS) are output. The chip-select-control signal CSBTF transitions from a low level to a high level later than a specific time at which the command clock enable signal (WT/RD_CLKEN) transitions from a high level to a low level.

That is, the specific time in which the chip-select-control signal CSBTF transitions from a low level to a high level is increased as denoted by (B). The specific time in which the clock enable signal CLKEN is abnormally transitioned to a low level can be removed as denoted by (C) of FIG. 7.

If the chip select signal CSB is at a low level, the write (WT) or read (RD) command signal to the clock control device. After lapse of a predetermined time upon receiving the WT or RD command signal, the internal clock CLK may be unnecessary.

When the clock enable signal CLKEN and the fast chip select signal (FAST_CS) are latched to a high level in response to the clock control signal (CLK_I), the command clock enable signal (WT/RD_CLKEN) transitions from a high level to a low level. After the command clock enable signal (WT/RD_CLKEN) transitions to a low level, the clock enable signal CLKEN remains at a logic high level by the command clock enable signal (WT/RD_CLKEN).

That is, the operation time of the clock signal (CLK) is established on the basis of a specific time interval in which the chip select signal CSB is at a low level. If the chip select signal CSB is deactivated to a high level, the clock enable signal CLKEN is activated to a high level in response to the clock control signal (CLK_I). After a lapse of a predetermined time after receiving the WT or RD command, if the clock enable signal CLKEN is activated to a high level, a specific time capable of generating an internal clock is provided.

As is apparent from the above description, the clock control device according to embodiments can reduce the amount of current consumption by controlling an internal clock using the chip select signal when the semiconductor device operates at a high speed.

Those skilled in the art will appreciate that the present invention may be carried out in other specific ways than those set forth herein without departing from the spirit and essential characteristics of the present invention. The above example embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an example embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A clock control device comprising:
    a chip-select-signal control block configured to generate a chip-select-control signal by latching a chip select signal, and output a fast chip select signal according to the chip-select-control signal; and
    a clock control block configured to drive a clock signal in response to the fast chip select signal when a command clock enable signal is activated, thereby generating a clock control signal,
    wherein the chip-select-signal control block latches the chip-select-control signal, and controls the chip-select-control signal to be toggled after the command clock enable signal is transitioned.

2. The clock control device according to claim 1, wherein the chip-select-signal control block includes:
    a first buffer configured to buffer the chip select signal during normal operation;
    a second buffer configured to buffer the chip select signal during high-speed operation;
    a chip-select-signal controller configured to generate the fast chip select signal by combining an output signal of the second buffer and the chip-select-control signal;
    a delay unit configured to delay an output signal of the first buffer; and
    a latch unit configured to latch an output signal of the delay unit in response to the clock control signal so as to output the chip-select-control signal.

3. The clock control device according to claim 2, wherein the chip-select-signal controller includes:
    a delay unit configured to adjust a setup/hold time of the output signal of the second buffer; and
    a combination unit configured to combine the output signal of the delay unit, the chip-select-control signal, and the output signal of the second buffer, and generate the fast chip select signal.

4. The clock control device according to claim 3, wherein the delay unit delays a signal generated at a specific time at which the output signal of the second buffer transitions from a low level to a high level for a predetermined time.

5. The clock control device according to claim 2, further comprising:
    a buffer enable unit configured to output an enable signal for activating the first buffer and the second buffer.

6. The clock control device according to claim 2, wherein the latch unit includes:
    a comparator configured to detect the output signal of the delay unit in response to the clock control signal, and output a latch signal;
    a latch controller configured to latch a first control signal in response to a state of the latch signal, and output the latched control signal; and
    a control signal generator configured to latch the first control signal in response to the clock control signal, and output the chip-select-control signal.

7. The clock control device according to claim 6, wherein the comparator compares a first delay signal and a second delay signal received from the delay unit when the clock control signal is activated, so that the comparator outputs a first latch signal and a second latch signal.

8. The clock control device according to claim 6, wherein:
    if the clock control signal is deactivated, an output signal of the comparator is precharged so that the latch controller does not operate.

9. The clock control device according to claim 6, wherein:
    the control signal generator latches the first control signal when the clock control signal is at a first level, and accordingly outputs a second control signal; and latches a second control signal when the clock control signal is at a second level, and accordingly outputs a third control signal.

10. The clock control device according to claim 9, wherein the control signal generator combines the first control signal, the second control signal, and the third control signal, and accordingly outputs the chip-select-control signal.

11. The clock control device according to claim 9, wherein the control signal generator is initialized when an initialization signal is activated.

12. The clock control device according to claim 1, wherein the chip-select-signal control block controls the fast chip select signal to transition from a high level to a low level after the command clock enable signal transitions from a high level to a low level.

13. The clock control device according to claim 1, wherein the clock control block includes:
    a clock buffer activated by a clock buffer enable signal so as to generate an internal clock;
    a clock driver configured to drive the internal clock in response to a clock enable signal so as to generate the clock control signal; and
    a clock controller configured to generate the clock enable signal according to the command clock enable signal, the fast chip select signal, and the clock control signal.

14. A clock control device comprising:
    a first buffer configured to buffer a chip select signal during normal operation;
    a second buffer configured to buffer the chip select signal during high-speed operation;
    a chip-select-signal controller configured to generate a fast chip select signal by combining an output signal of the second buffer and a chip-select-control signal;
    a delay unit configured to delay an output signal of the first buffer;
    a latch unit configured to latch an output signal of the delay unit in response to a clock control signal, and output the chip-select-control signal; and
    a clock controller configured to control a clock enable signal according to a command clock enable signal, the fast chip select signal, and the clock control signal.

15. The clock control device according to claim 14, wherein the chip-select-signal controller toggles the fast chip select signal after the command clock enable signal is transitioned.

16. The clock control device according to claim 14, wherein the chip-select-signal controller includes:
- a delay unit configured to adjust a setup/hold time of the output signal of the second buffer; and
- a combination unit configured to combine the output signal of the delay unit, the chip-select-control signal, and the output signal of the second buffer, and generate the fast chip select signal.

17. The clock control device according to claim 14, wherein the latch unit includes:
- a comparator configured to detect the output signal of the delay unit in response to the clock control signal, and output a latch signal;
- a latch controller configured to latch a first control signal in response to a state of the latch signal, and output the latched control signal; and
- a control signal generator configured to latch the first control signal in response to the clock control signal, and output the chip-select-control signal.

18. The clock control device according to claim 17, wherein:
- the control signal generator latches the first control signal when the clock control signal is at a first level, and accordingly outputs a second control signal; and latches a second control signal when the clock control signal is at a second level, and accordingly outputs a third control signal.

19. The clock control device according to claim 18, wherein the control signal generator combines the first control signal, the second control signal, and the third control signal, and accordingly outputs the chip-select-control signal.

20. The clock control device according to claim 14, further comprising:
- a clock driver configured to drive an internal clock in response to the clock enable signal, and generate the clock control signal.

* * * * *